United States Patent
Barnes et al.

(10) Patent No.: US 6,521,082 B1
(45) Date of Patent: Feb. 18, 2003

(54) MAGNETICALLY ENHANCED PLASMA APPARATUS AND METHOD WITH ENHANCED PLASMA UNIFORMITY AND ENHANCED ION ENERGY CONTROL

(75) Inventors: Michael S Barnes, San Ramon, CA (US); Hongqing Shan, Cupertino, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/124,161

(22) Filed: Apr. 16, 2002

(51) Int. Cl.[7] .............................. H05H 1/00; H01L 21/00
(52) U.S. Cl. .............................. 156/345.46; 118/723 E; 204/298.37
(58) Field of Search ................... 156/345.46, 345.47, 156/345.42; 118/723 E, 723 MA; 204/298.37

(56) References Cited

U.S. PATENT DOCUMENTS

| | | | |
|---|---|---|---|
| 5,718,795 A | 2/1998 | Plavidal et al. | |
| 5,880,034 A | * 3/1999 | Keller | 156/345.42 |
| 6,022,446 A | 2/2000 | Shan et al. | |
| 6,232,236 B1 | 5/2001 | Shan et al. | |

* cited by examiner

Primary Examiner—Thi Dang
(74) Attorney, Agent, or Firm—Randy W. Tung; Joseph Bach

(57) ABSTRACT

Within both a magnetically enhanced plasma apparatus and a magnetically enhanced plasma method there is employed: (1) a repetitive and geometrically selective pulsing of a magnetic field from a first level to a second level within a reactor chamber; and (2) a repetitive pulsing of a radio frequency power from a first level to a second level within the reactor chamber when repetitively and geometrically selectively pulsing from the first level to the second level the magnetic field within the reactor chamber. The concurrent repetitive pulsings provide a plasma within the reactor chamber with enhanced plasma uniformity and enhanced ion energy control.

12 Claims, 2 Drawing Sheets

MAGNETICALLY ENHANCED PLASMA APPARATUS AND METHOD WITH ENHANCED PLASMA UNIFORMITY AND ENHANCED ION ENERGY CONTROL

BACKGROUND OF THE INVENTION

1. Field of the Invention

The present invention relates generally to a magnetically enhanced plasma apparatus and a method for operating such an apparatus.

2. Description of the Related Art

Common in the art of microelectronic fabrication is the use of plasma chambers. Magnetically enhanced plasma chambers provide efficient etch methods and deposition methods for fabricating microelectronic circuits. Magnetically enhanced plasma chambers provide such efficiency insofar as they provide enhanced plasma density incident to magnetic field confinement of charged plasma species. However, in such magnetically enhanced plasma chambers it is sometimes difficult to control plasma uniformity and to provide enhanced ion energy.

It is thus towards the foregoing aspects of magnetically enhanced plasma chambers that the present invention is directed.

Various magnetically enhanced plasma apparatus and magnetically enhanced plasma methods having desirable properties have been disclosed in the art of microelectronic fabrication. Such apparatus and methods are often directed towards geometric factors of magnetic field confinement within magnetically enhanced plasma chambers. Related references include: (1) Plavidal et al., in U.S. Pat. No. 5,718,795; (2) Shan et al., in U.S. Pat. No. 6,022,446; and (3) Shan et al., in U.S. Pat. No. 6,232,236, the disclosures of which are incorporated herein fully by reference.

Desirable in the art of microelectronic fabrication are additional magnetically enhanced plasma apparatus and magnetically enhanced plasma methods which provide for enhanced plasma uniformity and enhanced ion energy control.

It is towards the foregoing that the present invention is directed.

SUMMARY OF THE INVENTION

A first aspect of the present invention is to provide a magnetically enhanced plasma apparatus and a magnetically enhanced plasma method.

A second aspect of the present invention is to provide a magnetically enhanced plasma apparatus and a magnetically enhanced plasma method in accord with the first aspect of the present invention, wherein the magnetically enhanced plasma apparatus and the magnetically enhanced plasma method provide enhanced plasma uniformity and enhanced ion energy control.

A third aspect of the present invention is to provide a magnetically enhanced plasma apparatus and a magnetically enhanced plasma method in accord with the first aspect of the present invention and the second aspect of the present invention, wherein the magnetically enhanced plasma apparatus is readily fabricated and the magnetically enhanced plasma method is readily commercially implemented.

In accord with the present invention, there is provided a magnetically enhanced plasma apparatus and a method for fabricating, for example, integrated circuits while employing the magnetically enhanced plasma apparatus.

In accord with the present invention, the magnetically enhanced plasma apparatus comprises a reactor chamber having assembled therein a platen. The magnetically enhanced plasma apparatus also comprises a radio frequency power source coupled to the reactor chamber. The magnetically enhanced plasma apparatus also comprises a plurality of magnetic field sources geometrically spaced surrounding and coupled to the reactor chamber. Finally, the magnetically enhanced plasma apparatus also comprises a controller which controls the radio frequency power source and the series of magnetic field sources such as to: (1) repetitively and geometrically selectively pulse from a first level to a second level a magnetic field within the reactor chamber; and (2) repetitively pulse from a first level to a second level a radio frequency power within the reactor chamber when repetitively and geometrically selectively pulsing from the first level to the second level the magnetic field within the reactor chamber.

The magnetically enhanced plasma apparatus of the present invention contemplates the method for fabricating integrated circuits while employing the magnetically enhanced plasma apparatus of the present invention.

The present invention provides a magnetically enhanced plasma apparatus and a magnetically enhanced plasma method, wherein the magnetically enhanced plasma apparatus and the magnetically enhanced plasma method provide enhanced plasma uniformity and enhanced ion energy control.

The magnetically enhanced plasma apparatus and the magnetically enhanced plasma method of the present invention realize the foregoing aspects within the context of a configurable magnetic field (CMF) magnetically enhanced plasma apparatus and a CMF magnetically enhanced plasma method (which provide for a repetitive and geometrically selective pulsing of a magnetic field within a reactor chamber from a first value of the magnetic field to a second value of the magnetic field), by coincident with the repetitive and geometrically selective pulsing of the magnetic field within the reactor chamber from the first value of the magnetic field to the second value of the magnetic field pulsing a radio frequency power within the reactor chamber from a first value of the radio frequency power to a second value of the radio frequency power.

A magnetically enhanced plasma apparatus in accord with the present invention is readily fabricated and a magnetically enhanced plasma method in accord with the present invention is readily commercially implemented.

The present invention employs apparatus and hardware as are generally known in the art of microelectronic fabrication, but assembled, programmed and operated in a fashion which provides at least in part the benefits of the present invention. Since it is thus at least in part an assembly, programming and operation of apparatus and hardware which provides at least in part the present invention, rather than the existence of apparatus and hardware which provides the present invention, the mag netically enhanced plasma apparatus of the present invention is readily fabricated and the magnetically enhanced plasma method of the present invention is readily commercially implemented.

BRIEF DESCRIPTION OF THE DRAWINGS

The aspects, features and advantages of the present invention are understood within the context of the description as set forth below. The description is understood within the context of the accompanying drawings, which form a material part of this disclosure, wherein.

DESCRIPTION OF EMBODIMENT

The present invention provides a magnetically enhanced plasma apparatus and a magnetically enhanced plasma method, wherein the magnetically enhanced plasma apparatus and the magnetically enhanced plasma method provide enhanced plasma uniformity and enhanced ion energy control.

The magnetically enhanced plasma apparatus and method of the present invention realize the foregoing objects within the context of a configurable magnetic field (CMF) magnetically enhanced plasma apparatus and method. The apparatus and the method provide for a repetitive and geometrically selective pulsing of a magnetic field within a reactor chamber from a first value to a second value of the magnetic field. Coincident with such pulsing of the magnetic field, a radio frequency power within the reactor chamber is pulsed from a first value of the radio frequency power to a second value of the radio frequency power.

The embodiment of the present invention provides particular value within the context of plasma etch processing of substrates employed within microelectronic fabrications, such as but not limited to integrated circuits, ceramic substrates, solar cell devices, sensor array devices and image array devices. However, the present invention is not so limited and may generally be employed within the context of plasma processing, such as plasma etch processing and plasma deposition processing, of substrates.

Figure 1:
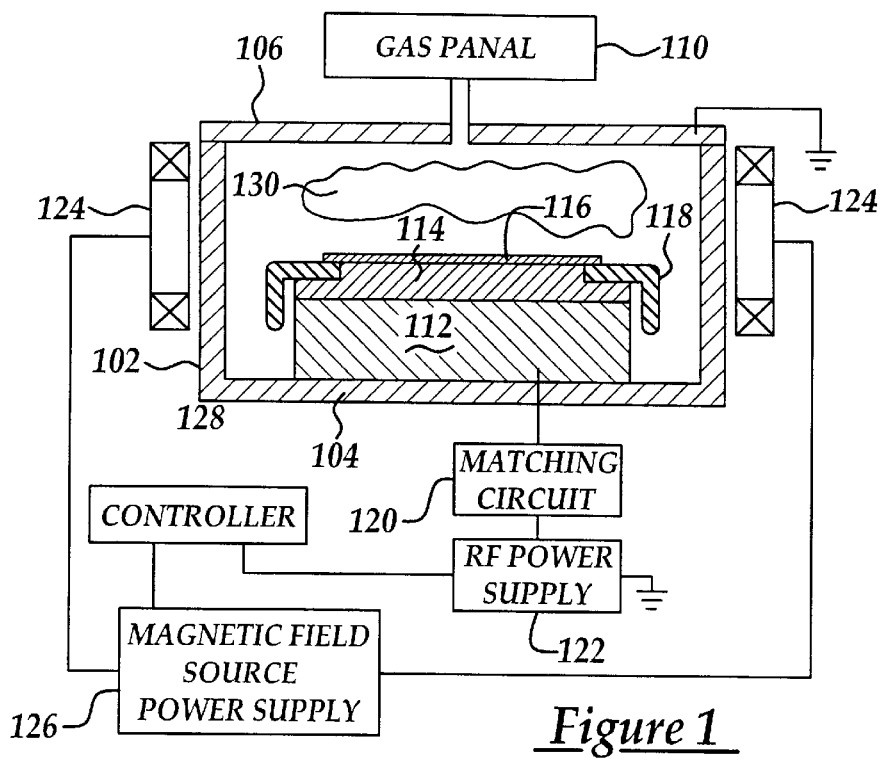
FIG. 1 shows a schematic cross-sectional and block diagram of a magnetically enhanced plasma apparatus in accord with an embodiment of the present invention.

Referring now to FIG. 1, there is shown a schematic cross-sectional and block diagram of a magnetically enhanced plasma apparatus in accord with an embodiment of the present invention.

As is illustrated within FIG. 1, the magnetically enhanced plasma apparatus comprises an enclosed reactor chamber comprising a contiguous sidewall 102, the contiguous sidewall 102 having assembled at its base periphery a floor 104 and at its upper periphery a roof 106. Assembled also within the enclosed reactor chamber is a pedestal assembly comprising a cathode 112 which is generally electrically isolated within the enclosed reactor chamber, where the cathode 112 in turn has assembled thereto a chuck 114 (which serves as a platen in accord with the invention), further in turn having assembled annularly surrounding thereupon a collar 118 (which may alternatively be referred to as a process kit). As is further illustrated within the schematic cross-sectional and block diagram of FIG. 1, a minimum of one substrate 116 (and alternatively multiple substrates) may be, and typically is, positioned within the enclosed reactor chamber spanning exposed portions of the chuck 114 and the collar 118.

Within the illustrated embodiment, the substrate 116 is typically employed within a microelectronic fabrication, but may also be employed within any of the alternative fabrications as disclosed above.

Reactant gases are supplied into the enclosed reactor chamber through a gas panel 110 which is external to but connected with the enclosed reactor chamber. The enclosed reactor chamber is surrounded by a plurality of magnetic field sources 124 which may be simultaneously or sequentially energized such as to provide a corresponding blanket magnetic field or a geometrically specific magnetic field within the enclosed reactor chamber. Typically, the series of magnetic field sources 124 comprises electromagnets, electromagnetic coils or related magnetic field sources which may be electrically energized, although the present invention does not preclude alternative methods for providing a magnetic field, such as but not limited to mechanical methods for providing a magnetic field.

A controller 128 controls both: (1) a radio frequency power supply 122 which in turn controls a matching circuit 120 which in turn powers the cathode 112 to provide thereto a radio frequency power coupled within the enclosed reactor chamber; and (2) a magnetic field source power supply 126 which powers the plurality of magnetic field sources 124 to provide a magnetic field coupled within the enclosed reactor chamber. Within the embodiment of the present invention, the radio frequency power and the magnetic field are adjusted in accord with the present invention to define and confine a plasma 130 within the enclosed reactor chamber, which plasma 130 processes the substrate 116 within the enclosed reactor chamber. Similarly, while the present invention is illustrated within the context of a substrate biased plasma, the present invention is also operative with a plasma which is effected absent a substrate bias.

Figure 2:
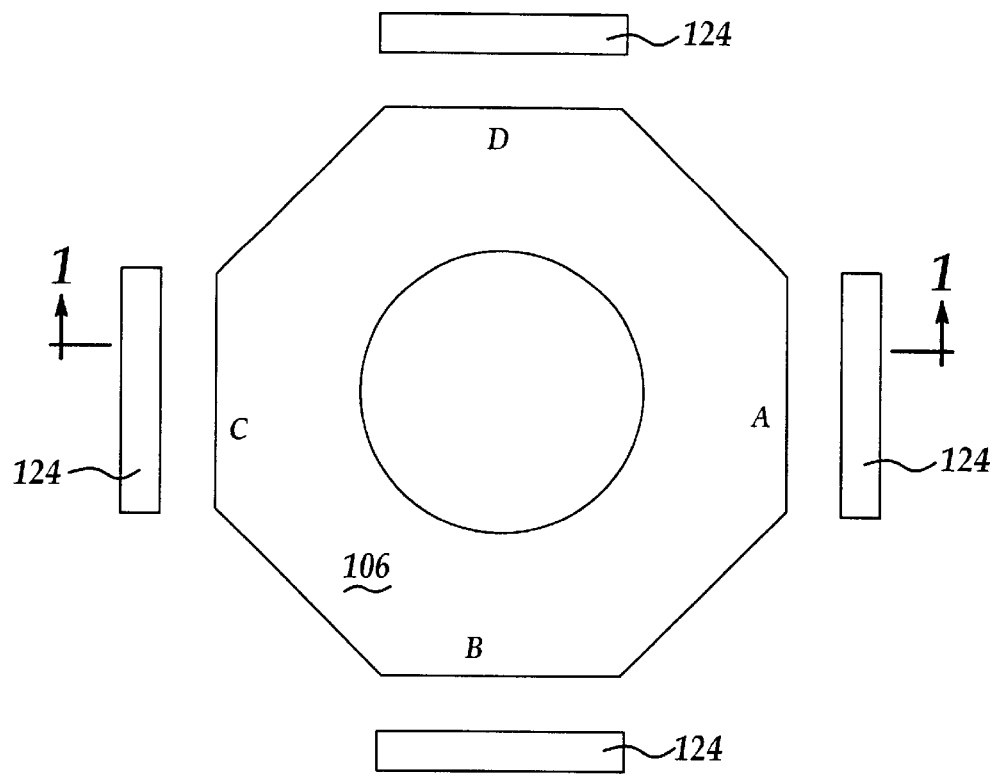
FIG. 2 shows a schematic plan-view diagram of the schematic cross-sectional portion of the magnetically enhanced plasma apparatus whose schematic cross-sectional and block diagram is illustrated in FIG. 1.

Referring now to FIG. 2, there is shown a schematic plan-view diagram corresponding with the schematic cross-sectional portion of the magnetically enhanced plasma apparatus whose schematic cross-sectional and block diagram is illustrated in FIG. 1.

FIG. 2 is a top view of the enclosed reactor chamber of FIG. 1, having a series of four magnetic field sources 124 which are concurrently or separately powered by the magnetic field source power supply 126 which in turn is controlled by the controller 128. Within the schematic plan-view diagram of FIG. 2, a series of four opposite or perpendicular sidewalls designated as A, B, C and D defines a series of four quadrants within the enclosed reactor chamber, the series of four quadrants being defined as an A-B quadrant, a B-C quadrant, a C-D quadrant and a D-A quadrant.

As is understood by a person skilled in the art, although the embodiment of the present invention as illustrated within the schematic plan-view diagram of FIG. 2 illustrates the present invention within the context of an octagonal shaped enclosed reactor chamber symmetrically surrounded by four magnetic field sources 124, the present invention is not intended to be so limited. Rather, the present invention may be practiced with respect to a reactor chamber of any shape, generally having symmetrically surrounding therearound any numbered plurality of magnetic field sources, but generally a minimum of three magnetic field sources.

Figure 3:
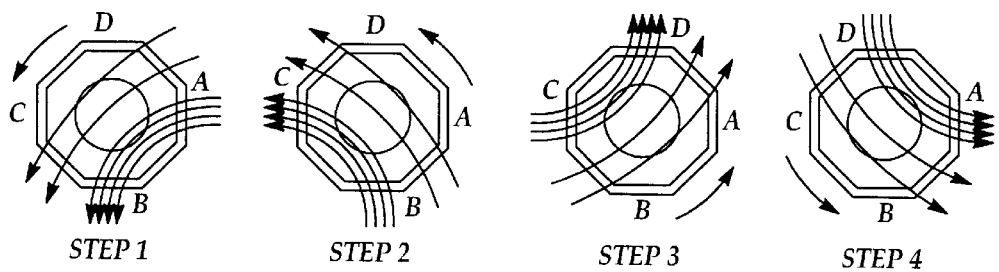
FIG. 3 shows a series of process step diagrams illustrating magnetic field geometric intensity within a magnetically enhanced plasma apparatus within which may be practiced the present invention.

Referring now to FIG. 3, there is shown a schematic process step diagram illustrating, with respect to magnetic field density, a configurable magnetic field (CMF) operation of the magnetically enhanced plasma apparatus whose schematic cross-sectional and block diagram is illustrated in FIG. 1, and a portion of whose schematic plan-view diagram is illustrated in FIG. 2.

As is illustrated within the schematic process step diagram of FIG. 3, and in accord with a process step-wise progression from step 1, to step 2, to step 3, and finally to step 4, a series of magnetic field sources 124 as illustrated within the schematic plan-view diagram of FIG. 2 and located at sidewalls A, B, C and D of the enclosed reactor chamber is cyclically and repetitively energized and pulsed such as to provide a pulsed magnetic field of a second (generally high) level unidirectionally (clockwise) repetitively cycling from quadrant A-B, to quadrant B-C, to quadrant C-D and finally to quadrant D-A. Within the illustrated embodiment of the present invention, the second level of the pulsed magnetic field is typically from about 5 to about 300 gauss, more typically from about 5 to about 60 gauss.

Within the illustrated embodiment, a quadrant opposite a pulsed quadrant (i.e., quadrant C-D, when quadrant A-B is pulsed) has a first (generally low) pulsed magnetic field, typically from about zero to about 25 gauss. Within the illustrated embodiment, a pair of quadrants adjoining a pulsed quadrant (i.e., quadrant B-C and quadrant D-A, when quadrant A-B is pulsed) has a pulsed magnetic field intermediate the first pulsed magnetic field and the second pulsed magnetic field.

Typically, the pulsed magnetic field cycling from quadrant to quadrant occurs on a dwell time scale of from about 0.025 to about 1 seconds per quadrant, more typically from about 0.1 to about 1 seconds per quadrant and most typically from about 0.25 to about 1 seconds per quadrant.

Figure 4:
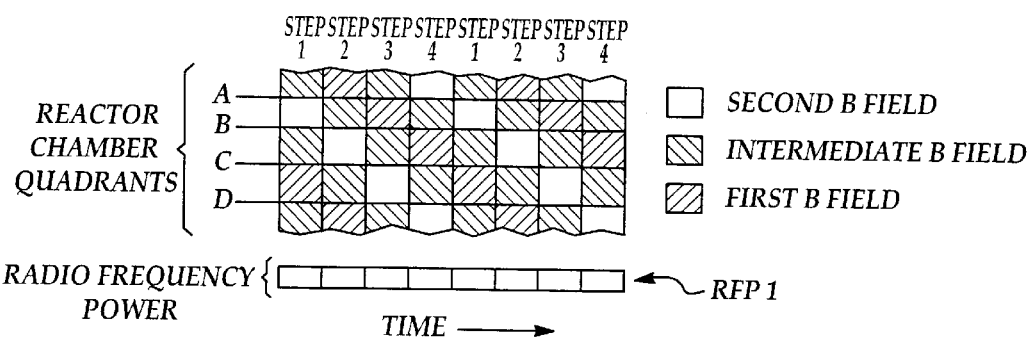
FIG. 4 shows a graph of Reactor Chamber Quadrants (with attendant magnetic field density) and Radio Frequency Power as a function of Time as derived in-part from the series of process steps within the process step diagrams of FIG. 3.

Referring now to FIG. 4, there is shown a schematic block diagram alternatively illustrating, in part, Reactor Chamber Quadrant (and associated magnetic field density) and Radio Frequency Power versus Time in accord with the schematic process step diagram of FIG. 3.

As is illustrated within the schematic block diagram of FIG. 4, an unshaded block corresponds with a second, generally high, pulsed magnetic field density, a shaded block corresponds with an intermediate magnetic field density, and a cross-hatched block corresponds with a first, generally low, magnetic field density. As is further illustrated within the schematic block diagram of FIG. 4 there is typically provided within the enclosed reactor chamber of FIG. 1 a constant first radio frequency power, designated as RFP1, typically in a range of from about 6E-3 to about 6E-2 watts per square centimeter substrate area.

Figure 5:
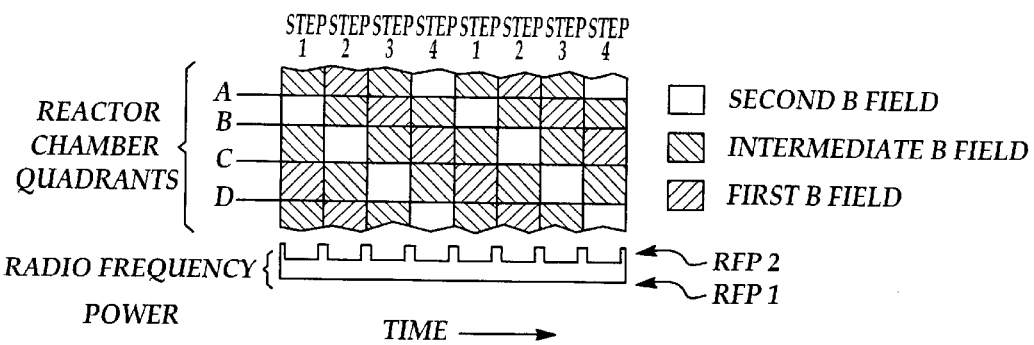
FIG. 5 shows a graph of Reactor Chamber Quadrants (with attendant magnetic field density) and Radio Frequency Power as a function of Time in accord with an illustrative embodiment of the present invention.

Referring now to FIG. 5, there is shown a schematic block diagram illustrating Reactor Chamber Quadrant (and attendant magnetic field density) and Radio Frequency Power versus Time in accord with the embodiment of the present invention.

As is understood by a person skilled in the art, the schematic block diagram of FIG. 5 corresponds generally with the schematic block diagram of FIG. 4. However, in FIG. 5 the radio frequency power is pulsed from the first radio frequency power RFP1 to a second radio frequency power RFP2 greater than the first radio frequency power RFP1, and then returned to the first radio frequency power RFP1. Such radio frequency power pulsing is repetitive, and corresponds with the pulsation of the magnetic field within the reactor chamber as illustrated within the schematic process step diagram of FIG. 3. The coordinated radio frequency power pulsing and magnetic field pulsing illustrated in the schematic block diagram of FIG. 5 is controlled through the controller 128 as illustrated within the schematic cross-sectional and block diagram of FIG. 1. Typically, the second radio frequency power RFP2 is from about 110 to about 200 percent of the first radio frequency power RFP1, and a dwell time at the second radio frequency power RFP2 is from about 5 to about 30 percent of a dwell time for magnetic field pulsing.

As is understood by a person skilled in the art, by pulsing a radio frequency power simultaneously with pulsing a magnetic field within the context of a configurable magnetic field (CMF) within a magnetically enhanced plasma apparatus in accord with the illustrated embodiment of the present invention, there is: (1) compensated for a pulsed magnetic field transit period when a plasma may not be stable and may thus otherwise result in chamber arcing and/or substrate arcing; and (2) compensated for a reflected radio frequency power spiking incident to magnetic field pulsing, which may also contribute to plasma induced chamber and/or substrate damage. Thus, within the present invention there is provided a CMF magnetically enhanced plasma apparatus and a CMF magnetically enhanced plasma method with enhanced plasma uniformity and enhanced ion energy control.

As is understood by a person skilled in the art, the embodiment of the magnetically enhanced plasma apparatus of the present invention and the magnetically enhanced plasma method of the present invention is illustrative of the present invention rather than limiting of the present invention. Revisions and modifications may be made to components, parameters and limits employed within the preferred embodiment of the magnetically enhanced plasma apparatus and magnetically enhanced plasma method of the present invention while still providing a magnetically enhanced plasma apparatus in accord with the present invention and a magnetically enhanced plasma method in accord with the present invention, further in accord with the accompanying claims.

What is claimed is:

1. A magnetically enhanced plasma apparatus comprising:
 a reactor chamber having assembled therein a platen;
 a radio frequency power source coupled to the reactor chamber;
 a plurality of magnetic field sources geometrically spaced surrounding and coupled to the reactor chamber; and
 a controller which controls the radio frequency power source and the plurality of magnetic field sources such as to:
 repetitively and geometrically selectively pulse from a first level to a second level a magnetic field within the reactor chamber; and
 repetitively pulse from a first level to a second level a radio frequency power within the reactor chamber when repetitively and geometrically selectively pulsing from the first level to the second level the magnetic field within the reactor chamber.

2. The apparatus of claim 1 wherein the platen is sized to accommodate a substrate employed within a microelectronic fabrication selected from the group consisting of integrated circuits, ceramic substrates, solar cell devices, sensor array devices and image array devices.

3. The apparatus of claim 1 wherein the controller is programmed to repetitively and cyclically geometrically selectively pulse the plurality of magnetic field sources from the first level of the magnetic field to the second level of the magnetic field within the reactor chamber.

4. The apparatus of claim 1 wherein the second level of the magnetic field is from about 5 to about 300 gauss.

5. The apparatus of claim 1 wherein the first level of the radio frequency power is from about 6E-2 to about 6E-3 watts per square centimeter platen area and the second level of the radio frequency power is from about 110 to about 200 percent of first level of the radio frequency power.

6. The apparatus of claim 1 wherein the magnetically enhanced plasma apparatus is selected from the group consisting of magnetically enhanced plasma etch apparatus and magnetically enhanced plasma deposition apparatus.

7. A magnetically enhanced plasma method for fabricating a fabrication comprising:
   providing a magnetically enhanced plasma apparatus comprising:
      a reactor chamber having assembled therein a platen;
      a radio frequency power source coupled to the reactor chamber;
      a plurality of magnetic field sources geometrically spaced surrounding and coupled to the reactor chamber; and
      a controller which controls the radio frequency power source and the plurality of magnetic field sources such as to:
         repetitively and geometrically selectively pulse from a first level to a second level a magnetic field within the reactor chamber; and
         repetitively pulse from a first level to a second level a radio frequency power within the reactor chamber when repetitively and geometrically selectively pulsing from the first level to the second level the magnetic field within the reactor chamber;
   positioning upon the platen a minimum of one substrate; and
   plasma processing the minimum of one substrate within the magnetically enhanced plasma apparatus while:
      repetitively and geometrically selectively pulsing from the first level to the second level the magnetic field within the reactor chamber; and
      repetitively pulsing from the first level to the second level the radio frequency power within the reactor chamber when repetitively and geometrically selectively pulsing from the first level to the second level the magnetic field within the reactor chamber.

8. The method of claim 7 wherein the substrate is employed within a microelectronic fabrication selected from the group consisting of integrated circuits, ceramic substrates, solar cell devices, sensor array devices and image array devices.

9. The method of claim 7 wherein the controller is programmed to repetitively and cyclically geometrically selectively pulse the plurality of magnetic field sources from the first level of the magnetic field to the second level of the magnetic field within the reactor chamber.

10. The method of claim 7 wherein the second level of the magnetic field is from about 5 to about 300 gauss.

11. The method of claim 7 wherein the first level of the radio frequency power is from about 6E-3 to about 6E-2 watts per square centimeter platen area and the second level of the radio frequency power is from about 110 to about 200 percent the first level of the radio frequency power.

12. The method of claim 7 wherein the magnetically enhanced plasma apparatus is selected from the group consisting of magnetically enhanced plasma etch apparatus and magnetically enhanced plasma deposition apparatus.

* * * * *